United States Patent [19]

Nowotarski

[11] Patent Number: 4,821,947

[45] Date of Patent: Apr. 18, 1989

[54] FLUXLESS APPLICATION OF A METAL-COMPRISING COATING

[75] Inventor: Mark S. Nowotarski, Ossining, N.Y.

[73] Assignee: Union Carbide Corporation, Danbury, Conn.

[21] Appl. No.: 154,081

[22] Filed: Feb. 8, 1988

[51] Int. Cl.⁴ .......................... B23K 1/06; B23K 35/38; H05K 3/34

[52] U.S. Cl. .................... 228/219; 228/180.1; 228/205; 228/206; 228/224; 228/37; 228/260; 228/262; 427/311; 427/329; 427/432; 427/436

[58] Field of Search ................ 228/180.1, 205, 206, 228/208, 214, 218–221, 223, 224, 260, 262, 37; 427/295, 311, 312, 329, 432, 436

[56] References Cited

U.S. PATENT DOCUMENTS

| | | | |
|---|---|---|---|
| 3,705,457 | 12/1972 | Tardoskgyi | 228/37 |
| 3,934,781 | 1/1976 | Klauke et al. | 228/37 |
| 4,504,007 | 3/1985 | Anderson, Jr. et al. | 228/123 |
| 4,530,457 | 7/1985 | Down | 228/180.1 |
| 4,538,757 | 9/1985 | Bertiger | 228/180.1 |
| 4,568,012 | 2/1986 | Kakuhata et al. | 228/180.1 |
| 4,606,493 | 8/1986 | Christoph et al. | 228/219 |
| 4,610,391 | 9/1986 | Nowotarski | 228/219 |
| 4,646,958 | 3/1987 | Howard, Jr. | 228/220 |
| 4,684,056 | 8/1987 | Deambrosio | 228/180.1 |

FOREIGN PATENT DOCUMENTS

| | | | |
|---|---|---|---|
| 246718 | 6/1987 | German Democratic Rep. | 228/223 |
| 95854 | 8/1978 | Japan | 228/219 |
| 82965 | 4/1986 | Japan | 228/221 |
| 286058 | 12/1986 | Japan | 228/37 |
| 563240 | 6/1977 | U.S.S.R. | 228/218 |

OTHER PUBLICATIONS

"Oxidation Prevention", IBM Technical Disclosure Bulletin, vol. 11, No. 12, p. 1687, May 1969.
Nowatarski et al., "The Effect of a Nitrogen Atmosphere on the Wave Tinning of Component Leads", Handout and Presentation at NEPCON WEST, Feb. 25, 1986.

Primary Examiner—Nicholas P. Godici
Assistant Examiner—Samuel M. Heinrich
Attorney, Agent, or Firm—Shirley L. Church

[57] ABSTRACT

This invention relates to an improved process for application of a metal-comprising coating to a metal-comprising surface without using a flux. The metal-comprising surface must be wettable by or become wettable upon contact with a bath of the metal-comprising coating. Application of the coating is carried out in an environment which is inert at least with respect to the coating material during the time period of its application to the metal-comprising surface, and preferably inert with respect to both the coating material and the metal-comprising surface. The inert environment temperature is sufficiently low that no damage is done to the metal-comprising surface and no damage is done to other materials adjacent to the metal-comprising surface.

30 Claims, 2 Drawing Sheets

FLUXLESS APPLICATION OF A METAL-COMPRISING COATING

BACKGROUND OF THE INVENTION

1. Field of the Invention

This invention relates to an improved process for application of a metal-comprising coating to a metal-comprising surface. More particularly, a method is disclosed which enables application of the coating without use of a flux in contact with the metal-comprising surface. The coating is applied in an atmosphere which is inert at least with respect to the coating material during the time period of its application.

2. Background of the Invention

Soldering and brazing are well known methods of joining metallic items to each other. Both involve wetting metal parts with a liquid "filler" metal at elevated temperature and then allowing the parts to cool below the solidus of the filler metal. When the filler metal solidifies, the parts are joined.

Tinning and galvanizing are well known processes whereby parts comprising a metal are given a protective metal coating by dipping the parts into a molten bath of the metal which is to provide the protective coating.

Soldering, tinning, galvanizing and similar processes which involve the wetting of a solid, metal comprised surface with a liquid metal-comprising coating require that the surface and the coating be clean and free from compounds which prevent wetting during application of the coating. Normal handling of the metal-comprising parts and the metal-comprising coating often results in the formation o compounds which are detrimental to wetting, such as metal oxides. In addition, the environment of the coating application process itself frequently causes the formation of such compounds. Other compounds typically formed during processing which are harmful to good wetting include chlorides, sulfides, carbonates and other ionic, covalent and organic compounds.

To obtain good wetting, and thus good bonding of coating to surface, such compounds must be reduced back to a metal, reacted to form another compound which is not detrimental to wetting, or removed by techniques such as dissolution or mechanical cleaning.

U.S. Pat. No. 4,538,757 to Bertiger, dated Sept. 3, 1985, discloses a method of wave soldering in an atmosphere comprising a gaseous reducing agent (hydrogen). However, practical experience has indicated the hydrogen reacts with metal oxides etc. at temperatures greater than about 600° C. Many of the plastics and resins comprising an electronic device such as a printed circuit board melt, degrade or change from their intended dimensions at the temperatures required to reduce oxides to a metallic state.

U.S. Pat. No. 4,606,493 to Christoph et al., dated Aug. 19, 1986, discloses a method and apparatus for soldering plate shaped circuit carriers whereby heated reducing gas (at about 600° C.) is used to reduce oxides at the solder side of the carriers. The high temperature gas is only briefly impinged upon the solder side of the carrier so that other materials comprising the board are not affected by the exposure to the high temperature gas. However, it is impractical to apply individual jets to heat only the metal-comprising surfaces of the carrier, and the areas adjacent to the metal-comprising surfaces will exhibit the same temperature as the metal-comprising surface.

The compounds detrimental to wetting can be reacted or dissolved and washed away from the metal-comprising surface or from the surface of a metal-comprising coating bath using a fluxing agent. Fluxing agents are the most commonly used method of obtaining a wettable part surface at the time of application of the metal-comprising coating. However, fluxing agents are typically corrosive and residues must be removed from the part after coating. In addition, should the amount of flux be insufficient, the solder or coating material can form icicles on the part as the part is removed from the coating bath; wetting time may be inadequate within the process so that poor bonding between part and coating occurs; and, dross production during processing may be high, leading to heavy maintenance requirements.

A method of soldering without a flux is disclosed in Japanese patent application No. 9,756/77 of K. Noboku et al., filed Feb. 2, 1977. Noboku et al. bring the article to be soldered into contact with a molten solder bath to which ultrasonic vibration is applied. The ultrasonic vibration is disclosed as causing cavitation which breaks up the oxidized metal on the part to expose an active, solderable surface. The major disadvantage of ultrasonic soldering is the potential for damage to the structural integrity of the part exposed to the ultrasonic vibration. In addition, ultrasonic soldering is geometrically dependent. The cavitating effect cannot reach some part areas such as the inside of small, plated holes of printed circuit boards.

There is a need in many soldering or metal coating operations, and particularly within the electronics industry, for an application method which does not require the use of high processing temperatures which can damage the part, which does not require the use of a flux, and which does not require mechanical vibration which can harm part structural integrity.

SUMMARY OF THE INVENTION

The present invention concerns a method of fluxless soldering or fluxless coating with a metal-comprising coating, wherein the part to be coated is not exposed to a temperature which harms the part or components thereof. The part is contacted with a bath or wave comprising the coating or solder material. The coating material is capable of forming compounds which can be detrimental to wetting during the time period the coating is applied to the part surface. Formation of the compounds detrimental to wetting is prevented by use of an inert environment in contact with the solder or metal comprised coating material as the coating material is applied to the part surface.

The part to be soldered or coated must have a wettable surface, i.e. a surface which can be wetted by the solder or metal-comprising coating material. Since the part surface may form compounds detrimental to wetting upon exposure to the process environment, the preferred inert environment is inert with respect to both the part wettable surface and to the solder or coating material. The inert environment may be inert with respect to the bath of solder or coating material also.

The environment is inert with respect to the coating material if a continuous solid is not formed on the metal comprised coating during its application to the part surface.

The environment is inert with respect to the part wettable surface if a continuous solid is not formed on the wettable surface during exposure of the wettable surface to the process environment.

The environment is inert with respect to the coating material bath if a continuous solid is not formed on the contact surface of the bath within the time period during which the bath is operational, at process temperature, pressure and bath flow pattern characteristics.

The inert environment can comprise any fluid which complies with the above applicable definition. The inert environment can also comprise a substantial vacuum or a partial vacuum wherein the remaining fluid complies with the above applicable definition.

In the electronics industry in general, inert atmospheres or environments can be provided using fluids such as nitrogen, argon, hydrogen, and mixtures thereof. Certain amounts of oxidizing gases are inert in behavior if they are present in low enough concentrations. For example, oxygen, $CO_2$, and $H_2O$ are all oxidizing to tin-lead solders at 200° C. 300° C. If they are present at concentrations less than about 1%, 100%, and 100% by volume, respectively, however, they will not form continuous oxides on the wettable part surface nor on the solder as it is applied to the wettable part surface.

When a partial vacuum provides the inert atmosphere and oxygen is present, the oxygen partial pressure should be below about 0.01 atmospheres, with a preferred partial pressure below about 0.001 atmospheres.

It is not necessary to use an environment which is inert to the part wettable surface if the wettable surface is protected by a coating which melts, vaporizes or undergoes chemical change to a liquid or a vapor upon contact with the solder or metal-comprising coating bath. The part wettable surface can also be protected by a coating which is wettable by the coating material and which can remain on the part surface after coating without affecting the intended use of the part. The protective coating is not a flux in that it does not dissolve away compounds from the surface of the part nor from the surface of the solder or coating bath; it serves only to protect the part from formation of the kind of compounds which prevent or are substantially detrimental to wetting. The protective coating can be any material which will protect the wettable surface from formation of the compounds previously described and leave the part to expose the wettable surface when the part is immersed in the metal-comprising coating material. The protective coating can also be any material which is wettable by the metal-comprising coating and which can remain on the part after application of the metal-comprising coating without affecting the intended use of the part.

In electronic industry soldering, protective coatings can be provided using materials such as tin, lead, bismuth, indium, cadmium and alloys thereof, which melt at solder temperatures, washing away any surface compounds or dirt from the wettable surface. Examples of other protective coating materials, which typically do not form compounds detrimental to wetting, include gold, silver, platinum and palladium. These protective coating materials may melt or may remain on the part surface, depending on the metal-comprising coating application temperature. Since they are adequate conductors, for many electronic applications gold, silver, platinum or palladium can remain on the part surface after soldering without affecting the intended use of the part. Organic materials can be used as the protective coating provided they melt, vaporize, or undergo a chemical change to form, at least substantially, a liquid or vapor upon contact with the metal-comprising coating bath. Inorganic materials can be used as protective coatings provided they vaporize, melt, or undergo a chemical change to a vapor, liquid, or material which is soluble in the metal-comprising coating upon contact with the bath.

The part itself may comprise a material which does not form significant amounts of compounds during storage or processing. The surface of the part then remains a wettable surface during storage and processing.

When the metal-comprising part surface is not coated by a protective coating and is not at least substantially inert with respect to the process environment for the time period of process exposure, it is necessary to select a different process environment which is inert to both the metal-comprising part surface and the metal-comprising coating material. If the metal-comprising part surface does not enter the process in a clean, wettable form, it must be cleaned and the metal-comprising coating applied before substantial formation of compounds which prevent wetting, or it must be cleaned and placed in an environment inert to the metal-comprising surfaces of the part prior to contact with the coating material bath. The cleaning may be accomplished by chemical or mechanical means, so the resulting part surfaces are wettable upon contact with the metal-comprising coating material bath. This latter method, wherein the part is cleaned, differs from soldering with a flux in that there is no coating of a fluxing material on the part surface at the time of contact of the surface with the solder bath.

The solder or metal comprised coating material must be protected from formation of the compounds which are detrimental to or prevent wetting during the time period of coating application to the wettable surface. Without this protection, icicles and bridging occur at the coated part surface. To accomplish this requirement, the metal-comprising coating bath is protected from formation of the compounds which prevent wetting at least in the area of the bath which contacts the wettable, metal-comprising part surface. It is preferred to have the entire solder or coating bath surface be protected from the formation of compounds which are detrimental to wetting.

For processes wherein it is not possible or reasonable to have the entire solder or coating bath protected by a fluid which is inert to the metal-comprising coating material, flux can be used on the solder or coating bath surface so long as it does not enter the area of the bath immediately contacting the wettable part surface. The flux dissolves or reacts with the undesirable compounds so they are removed and do not build up within the bath over time. Presence of the flux on the solder or coating bath surface at a location outside of the part contact area assists in removal of the compounds from the bath in general, reducing the probability that such compounds will enter the contact area of the bath.

The method of the present invention discloses a process which can be used for soldering or for coating of metal-comprising parts, whereby there is no need to use temperatures which are harmful to the metal-comprising part surfaces or which are harmful to other materials adjacent to the metal-comprising part surfaces. Typically, there is no need to use environment temperatures above the temperature of the solder or metal-comprising bath. The most commonly used solders require bath temperatures below about 450° C. and preferably below about 300° C. In addition, there is no need to use reducing gases, fluxes or ultrasonic vibration to achieve good bonding of the solder or metal-comprising coating to the metal-comprising part.

Thus, a typical example of the method of the present invention follows:

A method of bonding together at least two metal-comprising surfaces, comprising the steps of:

(a) providing at least two metal-comprising surfaces to be bonded, wherein each metal-comprising surface to be bonded is a wettable surface or a surface which becomes wettable upon contact with a metal-comprising bath;

(b) providing a bath which comprises a metal-comprising coating capable of forming at least one compound detrimental to wetting of the wettable surface, wherein at least a portion of the bath is protected from the formation of said at least one compound using an environment which is inert with respect to at least the metal-comprising coating during the time period of its application;

(c) contacting the metal-comprising surfaces to be bonded with the bath at a location within the bath which is protected by the inert environment, wherein the process environment temperature is sufficiently low that no damage is done to the metal-comprising surfaces and no damage is done to other materials adjacent to the metal-comprising surfaces during the process exposure time period; and, (d) permitting the metal-comprising surfaces to cool below the solidus of the metal-comprising coating subsequent to contact with the bath, so that the metal-comprising surfaces become bonded together by the metal-comprising coating.

The process environment, which is inert with respect to the solder or metal-comprising coating material, may not be sufficiently inert to the wettable part surface to prevent the formation of compounds detrimental to wetting on the part surface. In such case it is necessary to apply a protective coating to the wettable part surface, which coating is removed, if necessary, at time of contact with the solder or metal-comprising bath, or to select a different environment which is inert to both the wettable part surface and to the solder or metal-comprising coating material.

Another example of the method of the present invention follows:

A method of applying a metal-comprising coating to at least a portion of the metal-comprising surfaces of a part the method comprising the steps:

(a) providing a part having at least one metal-comprising surface which is wettable by a metal-comprising coating material or which becomes wettable on contact with a bath of metal-comprising coating material;

(b) providing a bath which comprises a metal-comprising coating material capable of forming at least one compound detrimental to wetting of the part surface, wherein at least a portion of the bath is protected from the formation of said at least one compound using an environment which is inert with respect to at least the metal-comprising coating during the time period of its application; and, (c) contacting the metal-comprising surface with the bath at a location within the bath which is protected by the inert environment, wherein the process environment temperature is sufficiently low that no damage is done to the part, including materials adjacent to the metal-comprising surface during the process exposure time period.

Again, the process environment which is inert with respect to the metal-comprising coating during the time of its application may not be sufficiently inert to the wettable part surface to prevent the formation of compounds detrimental to wetting of the part surface. In such cases, it will be necessary to apply a protective coating to the wettable part surface, or to select a different environment which is inert with respect to both the wettable part surface and the metal-comprising coating.

DEFINITIONS

Wettable surface as used in the specification and claims herein means a surface which can be wet by the solder or metal-comprising coating material.

Metal comprising part surface as used in the specification and claims herein means a surface comprising a metal, metal alloy, or mixture of metals.

Metal-comprising bath as used in the specification and claims herein means a fluid at process conditions, which comprises a metal, metal alloy or mixture of metals.

Inert environment as used in the specification and claims herein is defined in the Summary of the Invention with respect to the solder or metal-comprising coating material during the time period of its application, with respect to the part wettable surface and with respect to the solder or coating material bath.

Protective coating as used in the specification and claims herein means any coating which is a liquid, or which melts, vaporizes, or undergoes chemical change to a liquid or a vapor, upon contact with the metal-comprising bath. Protective coating also means any coating which is wettable by the metal-comprising coating and which can remain on the part after application of the metal-comprising coating without affecting the intended end use of the part.

Flux as used in the specification herein means a material which is a liquid at the metal-comprising bath temperature, which material dissolves compounds detrimental to wetting, or which material reacts chemically with compounds detrimental to or which prevent wetting so that such compounds become a liquid or a gas at the metal-comprising bath temperature.

DESCRIPTION OF THE PREFERRED EMBODIMENTS

EXAMPLE 1

It is often desirable in the electronics industry to coat component leads with solder prior to assembly into the final circuit. The leads may be coated with solder to protect the lead surfaces from oxidation during long term storage. Fresh solder may be applied to the surface of the leads just prior to soldering of the leads into the desired electronic component or configuration. The solder coating on the leads will melt and flow upon subsequent soldering, washing away any compounds detrimental to wetting which may have formed on the solder-coated leads. As a result, there are fewer unsoldered joints after final assembly soldering. The solder coating is typically applied by dipping the leads in a flux, then dipping the fluxed leads into the solder, and subsequently removing, e.g. washing, the flux and residues from the assembly.

Figure 1:
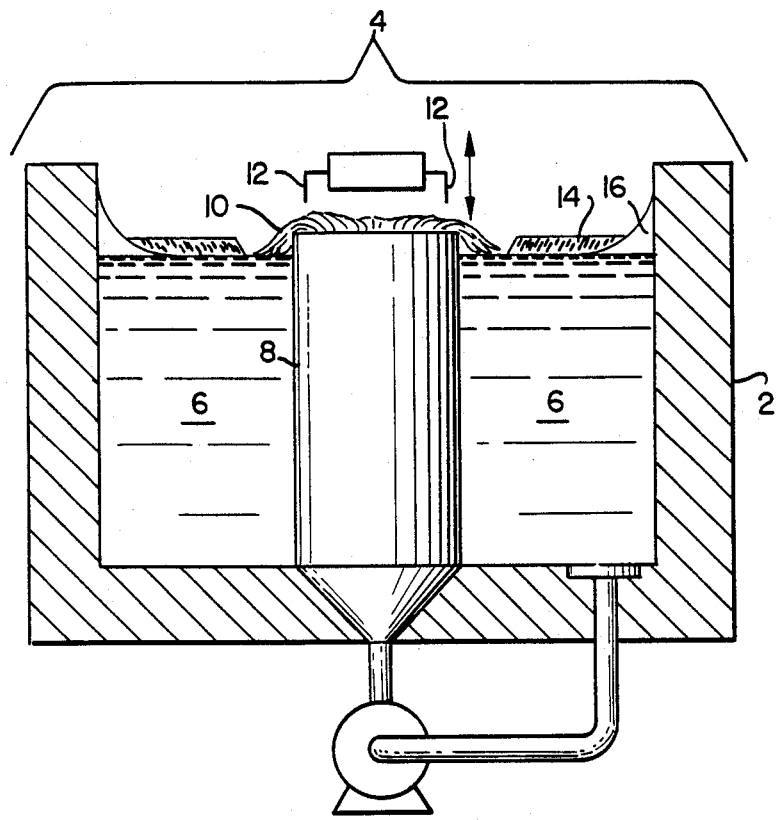
FIG. 1 shows a schematic for vertical tinning of electronic component leads using the method of the present invention.

To enable the application of solder to the leads without the need to use a flux, nitrogen was used to provide an environment inert to both the leads and to the solder. The nitrogen environment surrounded both the leads during the time the solder was applied and the solder bath. A schematic showing the process is provided in FIG. 1. The solder bath 2 was surrounded by a nitrogen environment 4. The solder 6 comprised about 60% by weight tin and about 40% by weight lead. The solder 6 temperature was about 250° C. The nitrogen environment 4 temperature surrounding bath 2 was room temperature, about 25° C. The solder 6 was recirculated within bath 2 by pumping it through a tube 8 so that it overflowed the top of tube 8, forming a fountain shaped wave 10 in the center of bath 2. The component leads to be soldered 12 were dipped into fountain shaped wave 10 at the center of the bath. The concentration of oxygen measured above solder wave 10 was less than about 10 ppm.

A flux 16 was applied to the edges of bath to assist in removal of oxides 14 which were present in the solder bath upon start up of the bath. The surface tension of the fluxes commonly used is such that flux positioned around the edge of the bath will tend to stay there. Use of flux 16 around the edge of bath 2 depends on the individual application.

It was discovered that tin lead solder could be applied to component leads comprising numerous different materials without using a flux in contact with the lead surface and still obtain completely covered leads with a smooth coat and without icicles or bridges between the leads.

The solder was applied to leads which were protected from formation of compounds detrimental to wetting by a protective coating. Copper leads protected with an electroplated tin lead coating, which coated leads had been stored for 4 years in a brown paper bag, were easily coated with solder using the method of the present invention. In addition, solder was applied to gold-plated nickel-comprising leads.

It was also discovered that solder could be applied to leads which were not coated with a protective coating prior to processing and which had built up oxides on the lead surfaces, provided these leads were chemically cleaned to provide a wettable surface prior to contact with the solder bath. Copper leads having oxides on the surface thereof were etched in 0.1M HCl in an air environment at room temperature (about 25° C.), were rinsed and dried in the air environment and were dipped into solder wave 10 within a time period of less than about 5 minutes subsequent to drying. There was not a substantial formation of compounds detrimental to wetting upon the copper lead surfaces in air at room temperature during the time period of less than 5 minutes. Leads of alloy 42, a nickel bearing alloy, were etched in 0.1M HCL in an environment at room temperature, were rinsed and dried in air, and then dipped into the solder wave within a time period of less than 5 minutes subsequent to drying.

In all of the above cases, the solder completely covered the leads with a smooth coat, and without the formation of icicles and/or bridges between the leads. Without the use of nitrogen environment 4 over the surface of bath 2, icicles and bridging of coating occurred on the coated leads. If desired, when the leads are covered by a protective coating or do not form detrimental compounds during process exposure time prior to coating, it would be possible to make inert only the region of the solder bath at which the contact with the part surface takes place, e.g. the area surrounding fountain-shaped wave 10 wherein application of the solder to the leads occurs. If this were done, oxide 14 would form on the bath surface areas not protected by the inert atmosphere and make it more necessary to use flux 16 to remove oxides 14 which would be continually forming during the soldering operation.

EXAMPLE 2

Wave soldering is a common method of forming solder joints between components and circuit traces on a circuit board. The leads of the component parts are inserted into metal-coated holes in the circuit board, or the components are glued onto the bottom of the circuit board with their leads touching the metal pads to which they are to be soldered. The boards and components are normally coated with a flux, preheated to about 100° C., and then passed over the surface of a pumped solder wave. The solder wets the leads and metallized portions of the board, and joints between the leads and the circuit board conductive paths are formed. After the board leaves the soldering wave, the flux and residues are cleaned off.

Figure 2:
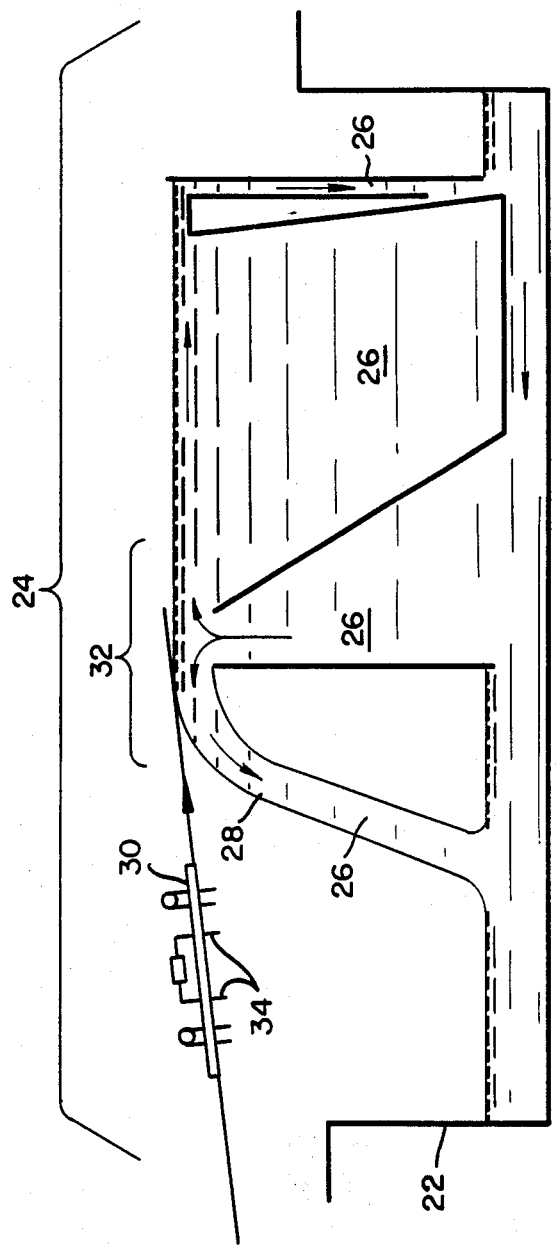
FIG. 2 shows a schematic for conveyorized soldering of printed circuit boards using the method of the present invention.

Components were successfully soldered to circuit boards without using a flux, by inerting the process area surrounding the bath comprising the solder wave with a nitrogen atmosphere. FIG. 2 shows a schematic of the process used. Solder bath 22 was surrounded by a nitrogen atmosphere 24. The solder 26 in bath 22 was pumped to form a wave 28 toward the font part of bath 22. The solder 26 was comprised of about 60% by weight tin, about 38% by weight lead, and about 2% by weight antimony. The temperature of solder 26 was about 250° C. The temperature of nitrogen atmosphere 24 was room temperature, about 25° C. A circuit board 30 was passed through wave 28 near the top of the wave at contact area 32. Component part leads 34 in contact with metallized portions of circuit board 30 were successfully soldered to the metallized portions with which they were in contact. The temperature of circuit board 30 was about 30° C. at the time it contacted solder 26 at contact point 32.

Circuit boards having metallized sites to which component leads were to be soldered were obtained with a tin lead alloy already applied to the metallized sites on the boards. Various kinds of component leads were soldered to the tin lead plated circuit boards. All of the component leads soldered to the circuit boards were coated with a protective coating prior to soldering by the method of the present invention. In some cases, copper component leads were tin lead plated so that upon soldering the compounds detrimental to wetting which had formed on the surface of the plating material would be washed away, when the plating material melted, exposing the copper component lead surface or clean tin-lead surface, thus rendering the component leads wettable in general. In other cases, copper component leads were plated with gold or silver which did not form compounds detrimental to the wettability of the lead surfaces and which could remain on the leads after soldering. Good solder joints were formed between all leads and the appropriate circuit board conductive path. However, when the component leads were inserted into the tin lead coated metallized holes within circuit boards, the solder did not always wet completely up through the holes the leads were in. Complete wetting up through the holes was achieved by mechanical agitation of circuit board 30 as it passed through contact point 32 of solder wave 28. Complete wetting up through the holes was also achieved when the circuit boards and component leads were etched with glacial acetic acid in an air environment, at room temperature, were rinsed and dried in air at room temperature and were contacted with the solder bath within a time period of less than about 2 minutes after drying.

To demonstrate the concept of using a removable protective coating, which is removed by the solder upon contact with the solder bath, in combination with an inert environment, the circuit boards were sprayed with a silicone lubricant which normally renders circuit boards unsolderable. The boards were then soldered using the wave soldering process described above. The silicone lubricant, which is a liquid in the solder wave, was washed away from the metallized circuit board soldering sites upon contact with the soldering wave, and good solder joints were formed between the tin lead plated component leads and the tin lead plated circuit board soldering sites.

The method of the present invention provides a reliable and economic method of insuring a good bond between a metal-comprising coating and metal-comprising parts. Use of the method eliminates the maintenance and clean up problems associated with the use of a flux. Use of the method has been shown to prevent formation of icicles. Icicles are formed as the metal-comprising parts are removed from the coating bath, due to continuous oxides present on the coating surface. Use of the method has also been shown to increase wetting rates of the metal comprised surfaces, providing a general improvement over previously known methods of soldering or coating. The ability to accomplish all of the above at temperatures which are not detrimental to the parts to be coated or soldered and without the use of ultrasonic vibrations which can harm part structural integrity substantially and particularly benefits the electronics industry in circuit board and semiconductor component manufacture.

The above examples present the best modes contemplated, and preferred embodiments for typical applications of the present invention. This invention has a broad range of applicability, however, and is susceptible to modification and alternate constructions based on the embodiments disclosed. Consequently, it is not intended that the preferred embodiments act as limitations of this invention. On the contrary, the intent is to include all modifications and alternate constructions falling within the spirit and scope of the invention as expressed in the appended claims.

What is claimed is:

1. A method of bonding together at least two metal-comprising surfaces, comprising the steps of:
   (a) providing at least two essentially flux-free, metal-comprising surfaces to be bonded, wherein said metal-comprising surface is a wettable surface or a surface which becomes wettable upon contact with a metal-comprising bath;
   (b) providing a bath which comprises a metal-comprising coating capable of forming at least one compound detrimental to wetting of said wettable surface, wherein at least a portion of said bath is protected from the formation of said at least one compound using an environment which is inert with respect to at least the metal-comprising coating material during the time period of its application; and,
   (c) contacting said metal-comprising surface to be bonded with said bath at a location within said bath which is essentially flux-free and which is protected by s aid inert environment, and wherein said environment temperature is sufficiently low that no damage is done to said metal-comprising surfaces and no damage is done to other materials adjacent to said metal-comprising surfaces.

2. The method of claim 1 including the step:
   (d) permitting said metal-comprising surfaces to cool below the solidus of said metal-comprising coating subsequent to contact with said bath, so that said metal-comprising surfaces become bonded together by said metal-comprising coating.

3. The method of claim 1 wherein said metal-comprising surface is coated with a protective coating which is removed upon contact with said bath.

4. The method of claim 3 wherein said protective coating is selected from the group consisting of metal comprised coatings which melt upon contact with said bath; metal-comprised coatings which dissolve in said bath at said bath temperature; inorganic coatings which melt, vaporize or undergo a chemical change to a liquid, vapor, or material which is soluble in the metal-comprising coating upon contact with said bath; and organic coatings which melt, vaporize or undergo a chemical change to form, at least substantially, a vapor or liquid upon contact with said bath.

5. The method of claim 1 wherein said wettable surface is a metal-comprised surface which does not form compounds detrimental to wetting.

6. The method of claim 1 wherein said wettable surface is generated by chemical or mechanical cleaning which is done sufficiently close to the time of contact with said bath that the wettable surface remains substantially free of compounds detrimental to wetting at the time of contact with said bath.

7. The method of claim 1 wherein said wettable surface is generated by chemical or mechanical cleaning after which said wettable surface is maintained in a sufficiently inert environment until time of contact with said bath that said wettable surface remains substantially free of compounds detrimental to wetting at the time of contact with said bath.

8. The method of claim 1 wherein said inert environment is inert with respect to both said wettable surface and said metal-comprising coating material.

9. The method of claim 1, claim 2, claim 3, claim 4, claim 5, claim 6, claim 7, or claim 8, wherein said inert environment is selected from the group consisting of nitrogen, argon, hydrogen, mixtures thereof, substantial vacuum, and partial vacuums comprising nitrogen, argon, hydrogen and mixtures thereof.

10. The method of claim 1, claim 2, claim 3, claim 4, claim 5, claim 6, claim 7, or claim 8, wherein said inert environment comprises an oxidizing agent, but wherein the concentration of said oxidizing agent is such that under process conditions there is no substantial formation of compounds detrimental to wetting with respect to at least the metal comprising coating material during the period of its application to each metal-comprising surface.

11. The method of claim 10 wherein said environment is selected from the group consisting of environments comprising oxygen at concentrations less than about 1% by volume, carbon dioxide at concentrations less than 100% by volume, water at concentrations less than 100% by volume, partial vacuums comprising oxygen at a partial pressure of less than about 0.01 atmospheres, partial vacuums comprising carbon dioxide, partial vacuums comprising water and mixtures thereof.

12. The method of claim 1 wherein said inert environment temperature is no higher than said metal-comprising bath temperature.

13. The method of claim 1 wherein said inert environment temperature is less than about 450° C.

14. The method of claim 1 wherein a flux is applied to said bath at a location not within said contacting area of said bath.

15. The method of claim 1 wherein said coating material or said surfaces to be joined are vibrated at frequencies less than 20,000 cycles per second.

16. A method of applying a metal-comprising coating to at least a portion of the metal-comprising surfaces of a part, comprising the steps of:
(a) providing a part having at least one metal-comprising surface which is wettable by a metal-comprising coating material or which becomes wettable on contact with a bath of metal-comprising coating material;
(b) providing a bath which comprises a metal-comprising coating material capable of forming at least one compound detrimental to wetting of said surface, wherein at least a portion of said bath is protected from the formation of said at least one compound using an environment which is inert with respect to at least the metal-comprising coating during the time period of its application; and,
(c) contacting said metal-comprising surface with said bath at a location within said bath which is essentially flux-free and which is protected by said inert environment, and wherein said process environment temperature is sufficiently low that no damage is done to said metal-comprising surfaces, and no damage is done to other materials adjacent to said metal-comprising surfaces during the process exposure time period.

17. The method of claim 16 including the additional step:
(d) permitting said metal-comprising coating to cool below its solidus subsequent to its application to said metal-comprising surface.

18. The method of claim 16 wherein said metal-comprising surface does not form compounds which are detrimental to wetting when exposed to said process environment.

19. The method of claim 16 wherein said metal-comprising surface is coated with a protective coating which is removed upon contact with said bath.

20. The method of claim 19 wherein said protective coating is selected from the group consisting of metal comprised coatings which melt upon contact with said bath; metal comprised coatings which dissolve in said bath at said bath temperature; inorganic coatings which melt, vaporize or undergo chemical change to a liquid, vapor, or material which is soluble in the metal-comprising coating upon contact with said bath; and organic coatings which melt, vaporize or undergo a chemical change to form, at least substantially, a vapor or liquid upon contact with said bath.

21. The method of claim 16 wherein said wettable surface is generated by chemical or mechanical cleaning which is done sufficiently close to the time of contact with said bath that th wettable surface remains substantially free of compounds detrimental to wetting at the time of contact with said bath.

22. The method of claim 16 wherein said wettable surface is generated by chemical or mechanical cleaning after which said wettable surface is maintained in a sufficiently inert environment until time of contact with said bath that said wettable surface remains substantially free of compounds detrimental to wetting at the time of contact with said bath.

23. The method of claim 16 wherein said inert environment is inert with respect to both said wettable surface and said metal-comprising coating material.

24. The method of claim 16, claim 17, claim 18, claim 19, claim 20, claim 21, claim 22, or claim 23 wherein said inert environment is selected from the group consisting of nitrogen, argon, hydrogen, mixtures thereof, substantial vacuum, and partial vacuums comprising nitrogen, argon, hydrogen or mixtures thereof.

25. The method of claim 16, claim 17, claim 18, claim 19, claim 20, claim 21, claim 22, or claim 23 wherein said inert environment comprises an oxidizing agent, but wherein the concentration of said oxidizing agent is such that under process conditions there is no substantial formation of compounds detrimental to wetting with respect to at least the metal-comprising coating material during the period of its application to each metal-comprising surface.

26. The method of claim 25 wherein said inert environment is selected from the group consisting of environments comprising oxygen at concentrations less than about 1% by volume, carbon dioxide at concentrations less than 100% by volume, water at concentrations less than 100% by volume, partial vacuums comprising oxygen at a partial pressure of less than about 0.01 atmospheres, partial vacuums comprising carbon dioxide, partial vacuums comprising water, and mixtures thereof.

27. The method of claim 16 wherein said inert environment temperature is no higher than said metal-comprising bath temperature.

28. The method of claim 16 wherein said inert environment temperature is less than about 450° C.

29. The method of claim 16 wherein a flux is applied to said bath at a location not within said contacting area of said bath.

30. The method of claim 16 wherein said coating material or said surfaces are vibrated at frequencies less than 20,000 cycles per second.

* * * * *